(12) United States Patent
Walker

(10) Patent No.: US 8,253,427 B2
(45) Date of Patent: Aug. 28, 2012

(54) RESISTANCE BRIDGE ARCHITECTURE AND METHOD

(75) Inventor: Richard W. Walker, Alpine, UT (US)

(73) Assignee: Fluke Corporation, Everett, WA (US)

( * ) Notice: Subject to any disclaimer, the term of this patent is extended or adjusted under 35 U.S.C. 154(b) by 492 days.

(21) Appl. No.: 12/497,318

(22) Filed: Jul. 2, 2009

(65) Prior Publication Data

US 2011/0001502 A1 Jan. 6, 2011

(51) Int. Cl.
*G01R 27/08* (2006.01)
(52) U.S. Cl. ........................................................ 324/706
(58) Field of Classification Search .................. 324/706, 324/705, 691, 649, 600
See application file for complete search history.

(56) References Cited

U.S. PATENT DOCUMENTS

| | | | |
|---|---|---|---|
| 3,676,774 A * | 7/1972 | Stokes et al. ............... | 324/706 |
| 5,371,469 A | 12/1994 | Anderson | |
| 2011/0001501 A1 | 1/2011 | Walker | |

FOREIGN PATENT DOCUMENTS

FR 2637985 4/1990

OTHER PUBLICATIONS

Extended European Search Report dated Nov. 24, 2010 regarding Application No. 10167917.3.
Lacanette, Kerry, "Data-acquisition system simplifies 5V RTD-to-digital conversion", EDN-Electrical Design News, vol. 41, No. 24, Nov. 21, 1996, pp. 102.
Walker, R. et al., "Achieving 0.25 mK uncertainty with an integrated-circuit resistance thermometer readout", Proceedings, XVII IMEKO World Congress, Jun. 22-27, 2003, pp. 1594-1597.

* cited by examiner

*Primary Examiner* — Hoai-An D Nguyen
(74) *Attorney, Agent, or Firm* — Christensen O'Connor Johnson Kindness PLLC

(57) ABSTRACT

One or more embodiments are directed to a resistance bridge having two voltage measurements circuits that function in tandem. In one embodiment, a constant current source may be applied to two resistors coupled in series, in which the first resistor has a known resistance and the second resistor has a resistance to be determined or verified. A first measurement circuit may measure a first voltage across the first resistor and at substantially the same time a second measurement circuit measures a second voltage across the second resistor. The voltage of each resistor is converted to a ratio. Based on the ratio and the resistance of the first resistance, the resistance of the second resistor may be calculated.

17 Claims, 3 Drawing Sheets

RESISTANCE BRIDGE ARCHITECTURE AND METHOD

TECHNICAL FIELD

This invention is directed to resistance bridge architecture, and more particularly one or more embodiments are directed to resistance bridge architecture using two measurement circuits.

BACKGROUND OF THE INVENTION

A resistance bridge is a device for comparing resistors by measuring a ratio between resistors. For instance, a resistance bridge may be used to determine a resistance value of a first resistor that is electrically coupled to a second resistor. The resistance bridge measures electrical parameters of the two resistors, and, based on the electrical measurements, a microprocessor coupled to the resistance bridge calculates a ratio of the two resistors. Resistance bridges may be used in a wide variety of applications that use resistance measurements, such as thermometers, resistor calibrators, multimeters and the like. In general, resistance bridge measurement circuits provide high accuracy measurements. However, the accuracy of any circuit depends on the stability of the electrical components within the circuit. Therefore, the accuracy of a resistance bridge measurement circuit may be limited by the stability of the electrical components within the bridge architecture. For instance, if drift is present in a current source of a resistance bridge measurement circuit, that drift may affect the accuracy of a measurement in the resistance bridge. Although the performance of the current source may be improved, some current drift will remain due to practical limitations in electrical components.

FIG. 1 is a schematic diagram of a resistance bridge measurement circuit 100 in the prior art coupled to two resistors $R_s$ 104 and $R_x$ 106. The resistance bridge measurement circuit 100 includes a current source 102, switches 108, and a measurement circuit 101. The measurement circuit 101 may include an amplifier 110 and an analog to digital converter (ADC) 112. The resistor $R_s$ 104 is a standard or reference resistor and has a known resistance. The resistor $R_x$ 106 may have an unknown resistance, such as a resistor to be calibrated or tested. The reference resistor $R_s$ 104 and the sensor resistor $R_x$ 106 are connected in series. When current is provided to the circuit by the current source 102, current flows through both the reference resistor $R_s$ 104 and the sensor resistor $R_x$ 106 simultaneously. When current flows through each resistor $R_s$ 104 and $R_x$ 106, a voltage across each resistor is generated that is proportional to each resistor's resistance. The amplifier 110 and the ADC 112 measure the voltage across each resistor sequentially. For instance, the voltage across $R_s$ 104 is $V_s$ and the voltage across $R_x$ 106 is $V_x$. Since only one voltage may be measured at a time, switches 108 are provided to couple the amplifier 110 and ADC 112 between the two resistors $R_s$ 104 and $R_x$ 106. Once the voltage across each resistor $R_s$ 104 and $R_x$ 106 has been measured, the voltages may be converted to a voltage ratio, which correspondence to a resistance ratio:

$$\frac{Vx}{Vs} = \frac{Rx}{Rs}$$

Because the value of the resistor $R_s$ 104 is known, the value of $R_x$ 106 may be determined from the ratio.

Because each resistor $R_s$ 104 and $R_x$ 106 are measured sequentially, any drift in the current source 102 or noise in the circuit may result in an inaccurate measurement. For instance, FIG. 1 illustrates the measurement circuit 100 with the switches 108 coupled to resistors $R_s$ 104. In this state, the amplifier 110 and ADC 112 measures the voltage across the resistor $R_s$ 104. Once the measurement has been made, the switches 108 may change state so that the amplifier 110 and the ADC 112 are coupled to the resistor $R_x$ 106 so that the voltage across the resistor $R_x$ 106 may be measured. Therefore, if the current source drifts between the time at which the resistor $R_s$ 104 is measured and the time at which the resistor $R_x$ 106 is measured, the ratio contains errors that affect the accuracy of the measurement circuit 100. In addition, any noise in the circuit 100 during the measurements may also affect the accuracy of the measurement.

There is, therefore, a need for a more accurate resistance bridge measurement circuit that reduces the affects of noise in the circuit or drift in the current source.

DETAILED DESCRIPTION

Embodiments of the present invention are directed toward resistance bridge architectures using two measurement circuits, and more particularly, one or more embodiments are directed to resistance bridge architectures using two measurement circuits in tandem. Certain details are set forth below to provide a sufficient understanding of the invention. However, it will be clear to one skilled in the art that the invention may be practiced without these particular details.

One or more embodiments utilize a resistance bridge having two voltage measurement circuits that function in tandem to measure a voltage across two resistors. The voltage across each resistor is used to calculate a ratio which may be used to determine a resistance of one of the resistors. For instance, a constant current may be applied to two resistors coupled in series. A first measurement circuit may measure a first voltage across a first resistor, which is a standard resistor with a known resistance. At the same time a second measurement circuit measures a second voltage across the second resistor, which has an unknown resistance. In one embodiment, the first and second voltages may be converted to a ratio in a microprocessor. For instance, the first voltage across the resistor having an unknown resistance may be divided by the voltage across the known resistor (or vice versa) to obtain a voltage ratio, which corresponds to a resistance ratio. From the ratio and the resistance of the known resistor, the resistance of the unknown resistor may be determined. By measuring the each resister at substantially the same time, both measurement circuits will include any noise or current drift that may have occurred during the measurements. Therefore, the current drift will be in each measurement and will therefore be at least partially cancelled out when the measurements are converted to the ratio.

In some embodiments, each measurement circuit may measure the voltage across each resistor. The two voltages across each respective resister may then be averaged. The average voltage for each resistor may be used to calculate a corresponding resistance ratio as discussed above. Thus, if either measurement circuit has gain errors, the gain errors will be present in both of the average voltages and therefore at least partially cancelled out. Additionally, by averaging the two voltages across each respective resister, any affects in the measurement caused by noise in the circuit or drift in the current source may be reduced. As will be clear to a person having ordinary skill in the art, using two voltage measurement circuits to measure the voltage across each resistor at substantially the same time improves the accuracy of the measurement.

Figure 1:
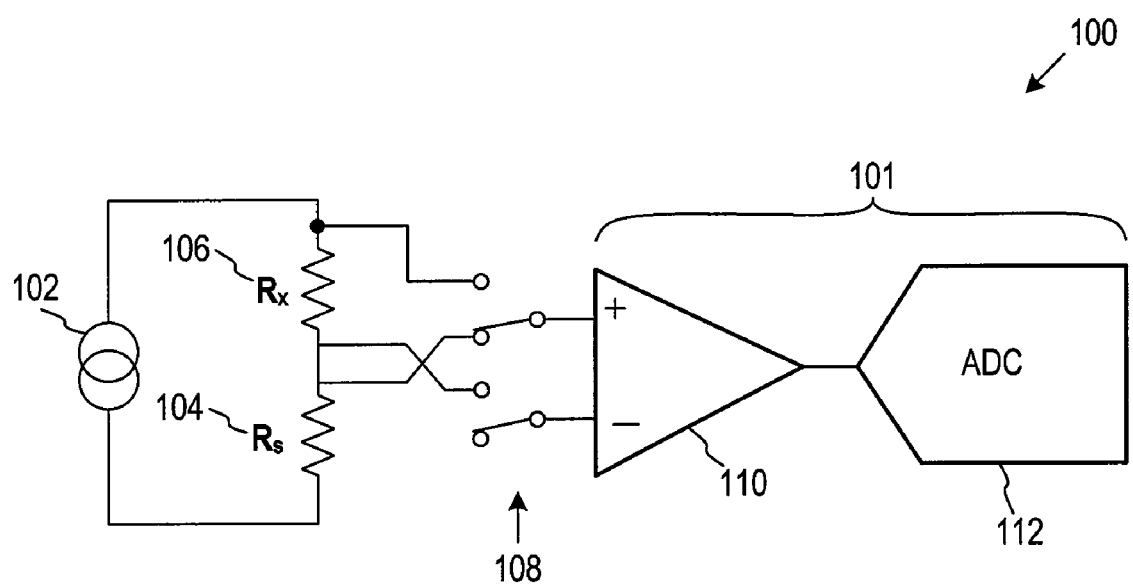
FIG. 1 is a schematic diagram of a resistance bridge measurement circuit in the prior art.
Figure 2:
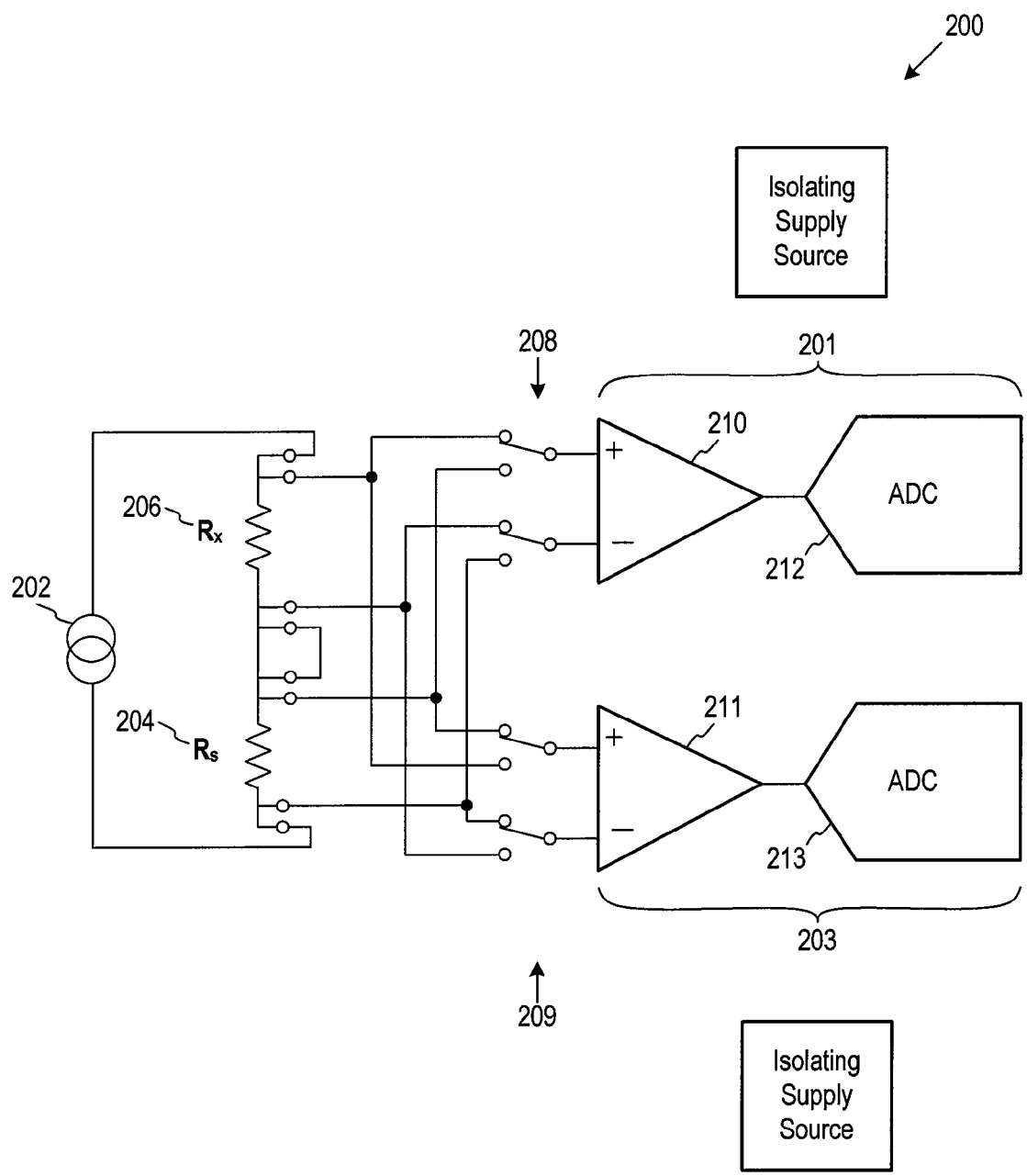
FIG. 2 is a schematic diagram of a resistance bridge measurement circuit according to one embodiment of the invention.

FIG. 2 is a schematic diagram of a resistance bridge measurement circuit 200 according to one embodiment of the invention. The resistance bridge measurement circuit 200 includes a current source 202, and two measurement circuits 201 and 203. The resistance bridge measurement circuit 200 is coupled to a standard or reference resistor $R_s$ 204, and a sensor resistor $R_x$ 206 similar to the resistance bridge measurement circuit 100 in FIG. 1. The resistor $R_s$ 204 and resistor $R_x$ 206 are connected in series. The resistor $R_s$ 204 has a known resistance value. The resistor $R_x$ 206 may be unknown or is a resistor to be calibrated or tested. The resistors $R_s$ 204 and $R_x$ 206 may be any type of resistor, such as a resistor having a resistance between 0 and 500 kiloohms. In some embodiments, the resistors have a resistance between 5 and 400 ohms.

The current source 202 provides current to the circuit 200 so that current flows through the resistors $R_s$ 204 and $R_x$ 206 simultaneously creating a voltage potential across each resistor $R_s$ 204 and $R_x$ 206. In one embodiment, the current source 202 is reversible. The two measurement circuits 201 and 203 may be configured to measure an electrical parameter, such as voltage. The measurement circuits 201 and 203 may be identical or different from one another. In some embodiments, the measurement circuits 201 and 203 include an amplifier 210 and 211, and an ADC 212 and 213, respectively. Each measurement circuit 201 and 203 are coupled to switches 208 and switches 209, respectively. The switches 208 and 209 may be any type of switch operable to change state. The switches 208 and 209 may be a single switch or two separate switches that function in tandem. In one embodiment, the switches 208 and 209 may be relay switches, such as electromechanical relay switches. In another embodiment, the switches 208 and the switches 209 may be analog switches. In this embodiment, the measurement circuits 201 and/or 203 may not include amplifier 210 or 211, respectively. For instance, the analog switches 208 and 209 may be coupled directly to the ADC 212 and 213, respectively.

In one or more embodiments, each measurement circuit 201 and 203 measures the voltage of a respective resistor $R_s$ 204 and $R_x$ 206 at substantially the same time. Therefore, noise or drift in the current source may be present in both measurements and once the measurements are presented as ratios, the noise or drift in the current source may be at least partially cancelled out. More particularly, if measurement circuit 201 measures the voltage across the resistor $R_x$ 206 at substantially the same time at which measurement circuit 203 measures the voltage across the resistor $R_s$ 204, both measurements may include noise generated by the current source 202. For instance in the state illustrated in FIG. 2, a first node of the amplifier 210 is coupled to a first node of the resistor $R_x$ 206 by the switch 208 and a second node of the amplifier 210 is coupled to a second node of the resistor $R_x$ 206 by the switch 208 so that the measurement circuit 201 may measure the voltage potential $V_x$ across the resistor $R_x$ 206. Additionally, a first node of the amplifier 211 is coupled to a first node of the resistor $R_s$ 204 by the switch 209 and a second node of the amplifier 211 is coupled to a second node of the resistor $R_s$ 204 by the switch 209 so that the measurement circuit 203 may measure the voltage potential $V_s$ across the resistor $R_s$ 204. As will be clear to a person having ordinary skill in the art, the timing of each voltage measurement may be made simultaneously or sufficiently close together in time such that any noise in the current source is measured in part or in whole by both measurement circuits 201 and 203.

In a microprocessor (not shown), the voltage potentials, $V_s$ and $V_x$, may be expressed as a voltage ratio, which corresponds to a resistance ratio. For instance in some embodiments, because resistance is proportional to voltage and the current is constant a resistance ratio may be calculated from the voltage potentials $V_s$ and $V_x$. For instance, using V=IR and knowing that the current source is constant, the voltage across resistor $R_s$ 204 and $R_x$ 206 may be expressed as follows:

$$\frac{Vx}{Vs} = \frac{Rx}{Rs}$$

Therefore, because the resistance value of voltage potential $V_s$, voltage potential $V_x$, and resistor $R_s$ 204 are known, the resistance value of resistor $R_x$ 206 may be calculated.

In one or more embodiments each measurement circuit 201 and 203 may measure the voltage across each resistor $R_s$ 204 and $R_x$ 206. Therefore, if there are any deficiencies in either of the measurement circuits 201 and 203, by measuring each resistor with both measurement circuit any gain caused by the individual measurement circuit may be cancelled out. More particularly, in addition to the measurement circuit 201 measuring a first voltage $V_{x1}$ across resistor $R_x$ 206 and the measurement circuit 203 measuring a first voltage $V_{s1}$ across resistor $R_s$ 204 as discussed above, the switches 208 and 209 may be flipped so that the measurement circuit 201 measures a second voltage $V_{s2}$ across resistor $R_s$ 204 and the measurement circuit 203 measures a second voltage $V_{x2}$ across resistor $R_x$ 206. For instance, the switches 208 may be flipped so that the first node of the amplifier 210 is coupled to the first node of the resistor $R_s$ 204 and the second node of the amplifier 210 is coupled to the second node of the resistor $R_s$ 204. Additionally, the switches 209 may be flipped so that the first node of the amplifier 211 is coupled to the first node of the resistor $R_x$ 206 and the second node of the amplifier 211 is coupled to the second node of the resistor $R_x$ 206.

In this embodiment, each voltage measurement made across each respective resistor $R_s$ 204 and $R_x$ 206 by each measurement circuit 201 and 203 may be combined and a ratio is calculated as described above. For instance, in one embodiment each voltage $V_{s1}$ and $V_{s2}$ across resistor $R_s$ 204 are averaged together, $V_{s1}$ being the voltage measured by measurement circuit 203 and $V_{s2}$ being the voltage measured by measurement circuit 201. Likewise, each voltage $V_{x1}$ and $V_{x2}$ across resistor $R_x$ 206 are averaged together, $V_{x1}$ being the voltage measured by measurement circuit 201 and $V_{x2}$ being the voltage measured by measurement circuit 203. The average of the voltages across each resistor $R_s$ 204 and $R_x$ 206 is converted into a voltage ratio, corresponding to a resistance ratio. For instance, the following equation may be used to determine the resistance ratio:

$$\frac{(Vx1+Vx2)/2}{(Vs1+Vs2)/2} = \frac{(Vx1+Vx2)}{(Vs1+Vs2)} = \frac{Rx}{Rs}$$

Therefore, using the known resistance of resistor $R_s$ 204, the resistance of $R_x$ 206 may then be calculated.

As will be clear to a person having ordinary skill in the art, when the switches 208 and/or the switches 209 are flipped, each corresponding measurement circuit 201 and 203 changes ground potential relative to the other measurement circuit 201 and 203 and relative to the direction of the current flowing in the circuit. Therefore, in some embodiments the power supply of the measurement circuits 201 may be isolated from the power supply of the measurement circuit 203. For instance, the power supply for each measurement circuit 201 and 203 may be isolated from the other while measurements are being made. In one embodiment, when the measurement circuits 201 and 203 measure the voltage across a respective resistor $R_s$ 204 and $R_x$ 206, the measurement circuits 201 and 203 may be electrically isolated from one another such that each is powered by a respective energy storage device, such as a battery or a capacitor. In between measurements, each energy storage device may be recharged. For instance in one embodiment, each energy storage device may be coupled to a switch-mode power converter operable to recharge the corresponding energy storage device. In one embodiment, the switch-mode power converters are DC-to-DC converters. During measurements, the switch-mode power converters may be decoupled from the energy storage devices and/or powered down. In another embodiment, rather than isolating the power supplies, the amplifier of each measurement circuit 201 and 203 may be used to shift the level to ground potential.

In some embodiments another set of measurements may be made in which the current in the circuit 200 is reversed. By first measuring the voltage with current flowing in a first direction and then measuring the voltage with current flowing in the opposite direction, offset voltages in the measurement circuits 201 and 203 may be eliminated, such as voltages that arise from thermoelectric electromotive forces (EMF). For instance, in one embodiment the current source 202 supplies current to the circuit in a clockwise direction so that current flows from the resistor $R_s$ 204 to the resistor $R_x$ 206. The measurement circuit 201 measures a first voltage potential $V_{x1}$ across the resistor $R_x$ 206 at substantially the same time that the measurement circuit 203 measures a first voltage potential $V_{s1}$ across the resistor $R_x$ 204. After the measurement is complete, the switches 208 and 209 flip so that measurement circuit 201 measures the voltage potential $V_{s2}$ across the resistor $R_s$ 204 at substantially the same time that the measurement circuit 203 measures the voltage potential $V_{x2}$ across the resistor $R_x$ 206.

After the above measurement is complete, the current source 202 may reverse the current so that current flows through the circuit 200 in a counter clockwise direction. While current is flowing through the circuit 200 in the counter clockwise direction, the measurement circuit 201 may again measure the voltage $V_{s3}$ across the resistor $R_s$ 204 at substantially the same time the measurement circuit 203 measures the voltage $V_{x3}$ across the resistor $R_x$ 206. After the measurement is complete the switches 208 and 209 flip so that measurement circuit 201 measures the voltage potential $V_{x4}$ across the resistor $R_x$ 206 at substantially the same time that the measurement circuit 203 measures the voltage potential $V_{s4}$ across the resistor $R_s$ 204.

The resultant voltage measurements, $V_{x1}$ and $V_{x4}$ are measured by measurement circuit 201 with current flowing in opposite directions. $V_{x2}$ and $V_{x3}$ are measured by measurement circuit 203 with current flowing in opposite directions. In a microprocessor, the difference between the voltages measured by each measurement circuit and each resistor with current flowing in opposite directions is determined. For instance, for measurement circuit 201 and resistor $R_x$ 206, the voltage $V_{x1}$ is subtracted from $V_{x4}$. For measurement circuit 203 and resistor $R_x$ 206, the voltage $V_{x2}$ is subtracted from $V_{x3}$. For measurement circuit 203 and resistor $R_s$ 204, the voltage $V_{s1}$ is subtracted from $V_{s3}$. For measurement circuit 203 and resistor $R_s$ 204, the voltage $V_{s2}$ is subtracted from $V_{s4}$. Additionally, the voltage potentials generated by each measurement circuit 201 and 203 may be combined, such as by averaging the measurements made by each measurement circuit for each respective resistor. For instance, the following equation may be used to determine the following ratio:

$$\frac{(Vx1-Vx4)+(Vx2-Vx3)}{(Vs2-Vs3)+(Vs1-Vs4)} = \frac{Rx}{Rs}$$

From the above equation, the resistance value of $R_x$ may be determined by substituting the known resistance value of $R_s$.

In one embodiment, the resistance bridge measurement circuit 200 of FIG. 2 may be used in conjunction with a thermometer. In particular, a thermometer probe may include a resistor that may coupled in series to a known resistor which are coupled to a resistance bridge measurement circuit. Once the resistance value of the resistor in the probe is determined, the resistance value and a temperature coefficient of resistance may be used to determine the temperature of the probe.

In another embodiment the resistance bridge measurement circuit 200 of FIG. 2 may be used to calibrate or test a resistor.

Figure 3:
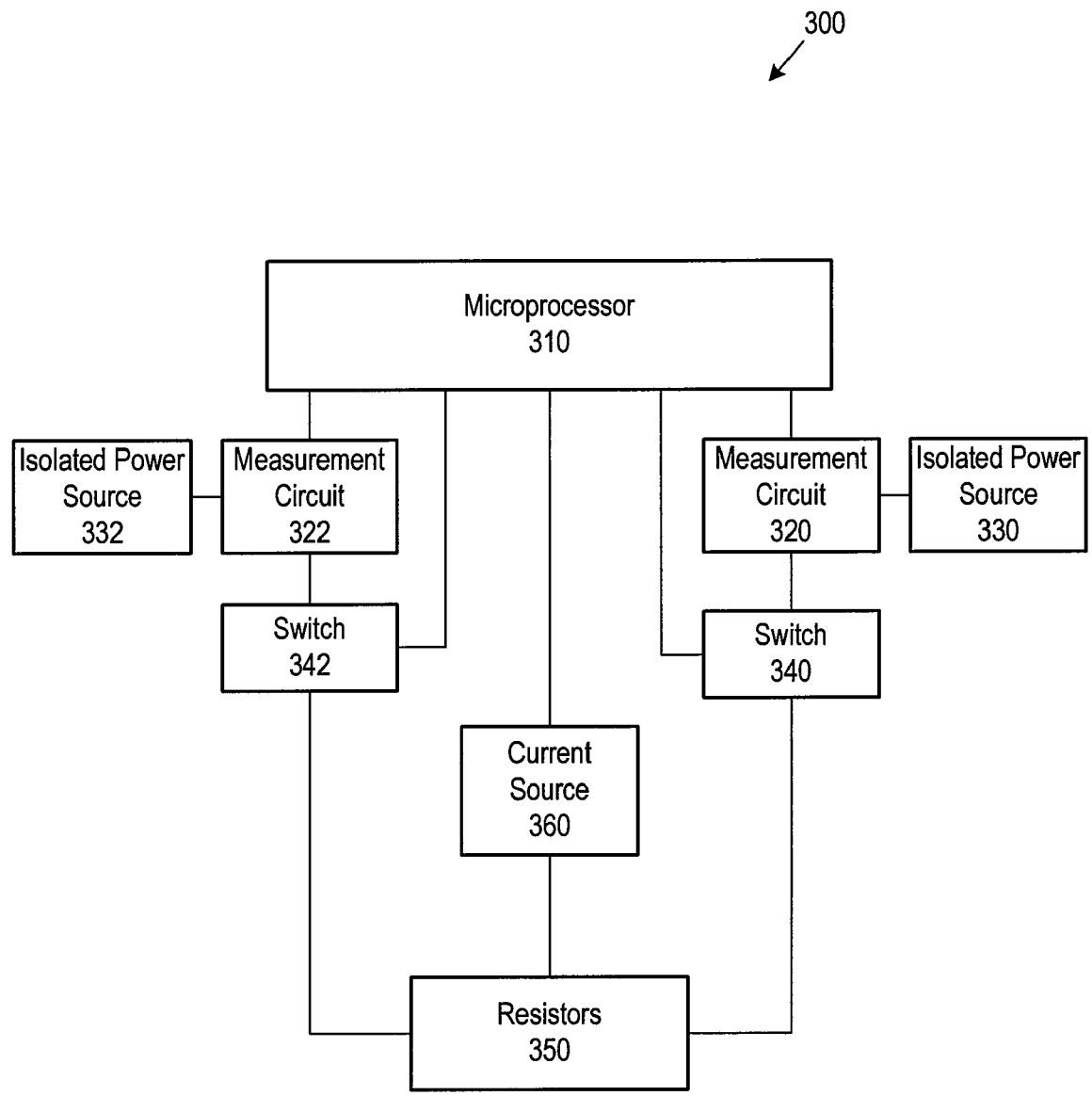
FIG. 3 is a system block diagram comprising a resistance bridge measurement circuit according to one embodiment of the invention.

FIG. 3 is a system 300 block diagram comprising a resistance bridge measurement circuit according to one embodiment of the invention. Many of the components in the system 300 operate in the same manner as the components in the resistance bridge measurement circuit 200 in FIG. 2. Therefore, in the interest of brevity their structure and function may not be repeated. The system 300 includes a microprocessor 310 coupled to two measurement circuits 320 and 322, switches 340 and 342, and current source 360. The microprocessor may be operable to control the state of switches 340 and 342. The measurement circuits 320 and 322 are further coupled to a respective switch 340 and 342. The measurement circuits 320 and/or 322 may include an amplifier and an ADC. In some embodiments the measurement circuits 320 and/or 322 may include an ADC that may be coupled to the switch 340 and 342. Each measurement circuit 320 and 322 may be coupled to a respective isolated power source 330 and 332. Each isolated power source 330 and 332 may be operable to power a respective measurement circuit 320 and 322 while a measurement is being made. The switches 340 and 342 may be coupled to resistors 350. The resistors 350 may be any number of resistors. The resistors 350 are coupled to the current source 360. The microprocessor may be operable to control the current being provided to the resistors 350 by the current source 360. The microprocessor 310 may be operable to calculate a voltage ratio from the various voltage measurements made by the measurement circuits 320 and 322. The voltage ratio corresponds to a resistance ratio. Furthermore, the microprocessor 310 may be operable to determine the resistance of one of the resistors using the voltage or resistance ratio, such as resistor $R_x$ from FIG. 2.

Although the present invention has been described with reference to the disclosed embodiments, persons skilled in the art will recognize that changes may be made in form and detail without departing from the spirit and scope of the invention. For example, as will be apparent to a person having ordinary skill in the art, the order in which the measurement circuits measure the voltage across each resistor or the order in which the current is provided through the circuit may be different from the embodiments illustrated and described above. Such modifications are well within the skill of those ordinarily skilled in the art. Accordingly, the invention is not limited except as by the appended claims.

What is claimed is:

1. A resistance bridge measurement circuit configured to be coupled to a first resistor and a second resistor, the first and second resistors being coupled in series, comprising:
    a current source coupled to the first and second resistors;
    a first voltage measurement circuit and a second voltage measurement circuit, the first voltage measurement circuit being configured to measure a first voltage across the first resistor and the second voltage measurement circuit being configured to measure a second voltage across the second resistor, the first voltage and the second voltage being measured at substantially the same time; and
    one or more switches selectively configurable to couple the first voltage measurement circuit across the second resistor to measure a third voltage across the second resistor, and to couple the second voltage measurement circuit across the first resistor to measure a fourth voltage across the first resistor, wherein the third voltage and the fourth voltage are measured at substantially the same time.

2. The resistance bridge measurement circuit of claim 1 further comprising a microprocessor being operable to calculate a ratio from the first and second voltages.

3. The resistance bridge measurement circuit of claim 2 wherein the ratio is a resistance ratio.

4. The resistance bridge measurement circuit of claim 2 wherein the microprocessor is further operable to calculate the resistance of the second resistor from the resistance of the first resistor and the ratio.

5. The resistance bridge measurement circuit of claim 1 wherein the current source is reversible.

6. The resistance bridge measurement circuit of claim 1 further comprising a microprocessor, the microprocessor being operable to calculate a first average of the first and fourth voltages and a second average of the second and third voltages, and convert the first and second average to a ratio.

7. The resistance bridge measurement circuit of claim 1 further comprising two switches, each switch configured to couple each voltage measurement circuit to the first and second resistors and to decouple each voltage measurement circuit from the first and second resistors.

8. The resistance bridge measurement circuit of claim 1 wherein the first voltage measurement circuit and the second voltage measurement circuit are powered by power supplies that are electrically isolated from each other when the first and second voltages are measured.

9. A thermometer configured to measure a voltage across a sensor resistor, comprising:
    a microprocessor;
    a first voltage measurement circuit and a second voltage measurement circuit, the first and second measurement circuits coupled to the microprocessor;
    a temperature probe comprising a first resistor, the first resistor being configured to be coupled in series with the sensor resistor;
    a current source configured to be coupled to the first resistor and the sensor resistor, the current source being configured to supply current to the first and sensor resistors; and
    a first switch and a second switch, the first switch coupled to the first voltage measurement circuit and the second switch coupled to the second voltage measurement circuit, each switch configured to couple and decouple its corresponding voltage measurement circuit to the first resistor and to the sensor resistor, the first and second switches being selectively configurable, wherein the first voltage measurement circuit is configurable to measure a first voltage across the first resistor and the second voltage measurement circuit is configurable to measure a second voltage across the sensor resistor, the first voltage and the second voltage being measured at substantially the same time, and wherein the first voltage measurement circuit is configurable to measure a third voltage across the sensor resistor and the second voltage measurement circuit is configured to measure a fourth voltage across the first resistor, the third voltage and the fourth voltage being measured at substantially the same time.

10. The thermometer of claim 9 wherein the first voltage measurement circuit is configured to measure a first voltage across the first resistor when the first switch couples the first voltage measurement circuit to the first resistor and the second voltage measurement circuit is configured to measure a second voltage across the sensor resistor when the second switch couples the second voltage measurement circuit to the sensor resistor, wherein the measurements are performed at substantially the same time.

11. The thermometer of claim 10 wherein the microprocessor is operable to determine the resistance of the sensor resistor using the resistance value of the first resistor and the first and second voltages.

12. The thermometer of claim 11 wherein the microprocessor is further configured to determine the temperature of the sensor resistor.

13. The thermometer of claim 10 wherein the first voltage measurement circuit and the second voltage measurement circuit each comprise a switch and an analog to digital converter.

14. A method of determining resistance in a circuit having a first resistor and a second resistor coupled in series, comprising:
    measuring a first voltage across the first resistor;
    measuring a second voltage across the second resistor, the first voltage being measured independently from the second voltage and at substantially the same time, wherein the first voltage is measured by a first measurement circuit and the second voltage is measured by a second measurement circuit that is different from the first measurement circuit;
    measuring a third voltage across the first resistor;
    measuring a fourth voltage across the second resistor, the third voltage being measured independently from the third voltage and at substantially the same time, wherein the third voltage is measured by the first measurement circuit and the fourth voltage is measured by the second measurement circuit; and obtaining a ratio based on the first, second, third, and fourth voltages and using the ratio and the resistance of the first resistor to determine the resistance of the second resistor.

15. The method of claim 14 further comprising reversing the direction the current flows through the first and second resistors and making subsequent voltage measurements across each resistor with each measurement circuit.

16. The method of claim 14 further comprising supplying power to the first measurement circuit by a first power source and supplying power to the second measurement circuit by a second power source while the measurements are made, the first power source being electrically isolated from the second power source.

17. The method of claim 14 wherein the act of obtaining a ratio from the first, second, third, and fourth voltages comprises averaging the first voltage and the third voltage to get a first average voltage and averaging the second voltage and the fourth voltage to get a second average voltage and calculating a ratio from the first average voltage and the second average voltage.

* * * * *

UNITED STATES PATENT AND TRADEMARK OFFICE
CERTIFICATE OF CORRECTION

| | |
|---|---|
| PATENT NO. | : 8,253,427 B2 |
| APPLICATION NO. | : 12/497318 |
| DATED | : August 28, 2012 |
| INVENTOR(S) | : R. W. Walker |

It is certified that error appears in the above-identified patent and that said Letters Patent is hereby corrected as shown below:

| COLUMN | LINE | |
|---|---|---|
| Title Page Item (57) 2 | Abstract 11 | "first resistance" should read --first resistor-- |
| In the Claims 8 (Claim 14, | 65 line 16) | after "measurement" delete ":" |

Signed and Sealed this
Twenty-second Day of April, 2014

Michelle K. Lee
*Deputy Director of the United States Patent and Trademark Office*